United States Patent
Nishio et al.

(10) Patent No.: US 11,443,946 B2
(45) Date of Patent: Sep. 13, 2022

(54) METHOD FOR MANUFACTURING SILICON CARBIDE BASE BODY, METHOD FOR MANUFACTURING SEMICONDUCTOR DEVICE, SILICON CARBIDE BASE BODY, AND SEMICONDUCTOR DEVICE

(71) Applicant: KABUSHIKI KAISHA TOSHIBA, Minato-ku (JP)

(72) Inventors: Johji Nishio, Machida (JP); Chiharu Ota, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 245 days.

(21) Appl. No.: 17/004,264

(22) Filed: Aug. 27, 2020

(65) Prior Publication Data
US 2021/0217619 A1    Jul. 15, 2021

(30) Foreign Application Priority Data
Jan. 9, 2020    (JP) .............................. JP2020-002078

(51) Int. Cl.
*H01L 29/15*    (2006.01)
*H01L 21/02*    (2006.01)
(Continued)

(52) U.S. Cl.
CPC .... *H01L 21/02694* (2013.01); *C23C 14/0635* (2013.01); *C23C 14/5873* (2013.01);
(Continued)

(58) Field of Classification Search
CPC ......... H01L 21/02378; H01L 21/02433; H01L 21/02529; H01L 21/02609; H01L 21/0262;
(Continued)

(56) References Cited

U.S. PATENT DOCUMENTS 5,585,648 A * 12/1996 Tischler ................ H01L 33/007
257/E33.068
7,646,026 B2    1/2010 Friedrichs et al.
(Continued)

FOREIGN PATENT DOCUMENTS

JP    4857697 B2    1/2012
JP    2013-063891 A    4/2013
(Continued)

OTHER PUBLICATIONS

Tawara et al., "Short minority carrier lifetimes in highly nitrogen-doped 4H-SiC epilayers for suppression of the stacking fault formation in PiN diodes", Journal of Applied Physics 120, 115101, 2016, 8 pages.

*Primary Examiner* — Brook Kebede
(74) *Attorney, Agent, or Firm* — Oblon, McClelland, Maier & Neustadt, L.L.P.

(57) ABSTRACT

According to one embodiment, a method for manufacturing a silicon carbide base body is disclosed. The method can include preparing a first base body including silicon carbide. The first base body includes a first base body surface tilted with respect to a (0001) plane of the first base body. A first line segment where the first base body surface and the (0001) plane of the first base body intersect is along a [11-20] direction of the first base body. The method can include forming a first layer at the first base body surface. The first layer includes silicon carbide. The method can include removing a portion of the first layer. The first-layer surface is tilted with respect to a (0001) plane of the first layer. A second line segment where the first-layer surface and the (0001) plane of the first layer intersect is along a [−1100] direction.

19 Claims, 9 Drawing Sheets

(51) Int. Cl.
*H01L 29/04* (2006.01)
*C30B 29/36* (2006.01)
*C30B 23/02* (2006.01)
*C30B 25/20* (2006.01)
*C23C 14/06* (2006.01)
*C23C 14/58* (2006.01)
*C23C 16/32* (2006.01)
*C23C 16/56* (2006.01)
*H01L 29/16* (2006.01)
*H01L 29/78* (2006.01)
*H01L 29/861* (2006.01)
*H01L 29/739* (2006.01)

(52) U.S. Cl.
CPC ............ *C23C 16/325* (2013.01); *C23C 16/56* (2013.01); *C30B 23/025* (2013.01); *C30B 25/20* (2013.01); *C30B 29/36* (2013.01); *H01L 21/0262* (2013.01); *H01L 21/02378* (2013.01); *H01L 21/02433* (2013.01); *H01L 21/02529* (2013.01); *H01L 21/02609* (2013.01); *H01L 21/02631* (2013.01); *H01L 29/045* (2013.01); *H01L 29/1608* (2013.01); *H01L 29/7395* (2013.01); *H01L 29/7802* (2013.01); *H01L 29/861* (2013.01)

(58) Field of Classification Search
CPC ......... H01L 21/02631; H01L 21/02694; H01L 29/045; H01L 29/1608; C23C 14/0635; C23C 16/325; C23C 16/56; C23C 14/5873; C30B 23/025; C30B 25/20; C30B 29/36

See application file for complete search history.

(56) References Cited

U.S. PATENT DOCUMENTS

| 10,323,335 | B2 | 6/2019 | Asamizu |
| 2009/0114969 | A1* | 5/2009 | Suzuki ................ H01L 29/0619 257/E21.054 |
| 2014/0209927 | A1 | 7/2014 | Nishio et al. |
| 2019/0064248 | A1 | 2/2019 | Goryu et al. |
| 2019/0244812 | A1 | 8/2019 | Nishio et al. |

FOREIGN PATENT DOCUMENTS

| JP | 2014-146748 A | 8/2014 |
| JP | 2017-059670 A | 3/2017 |
| JP | 6244826 B2 | 12/2017 |
| JP | 2019-040931 A | 3/2019 |
| JP | 2019-140186 A | 8/2019 |

* cited by examiner

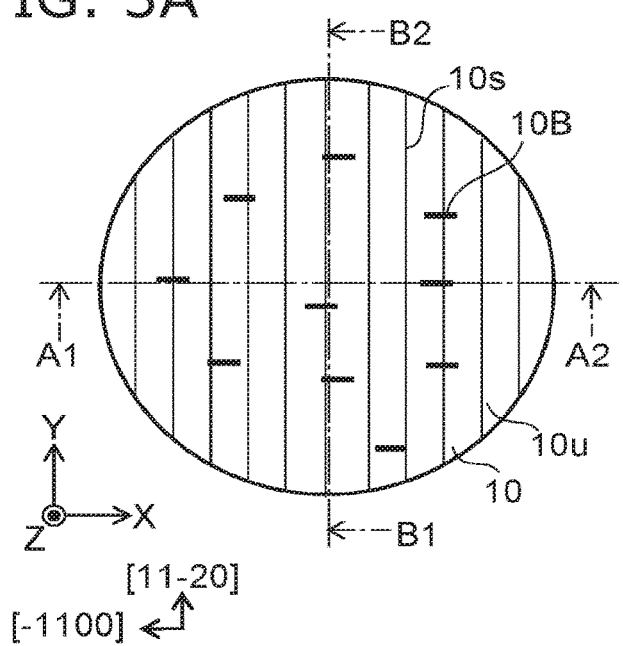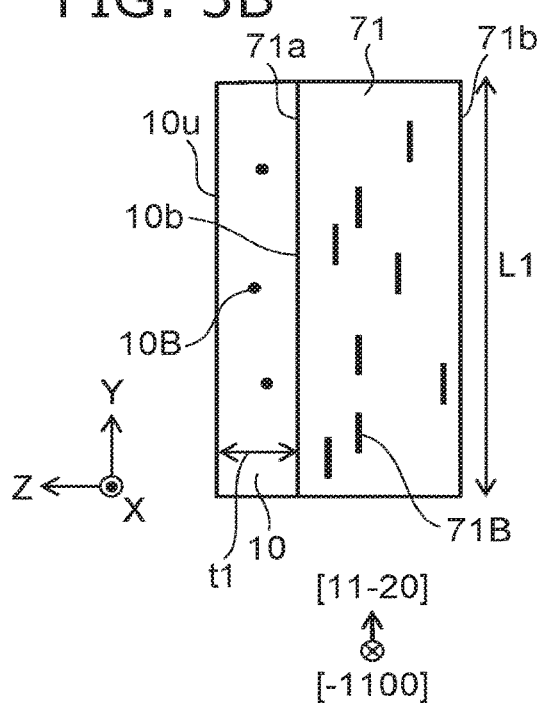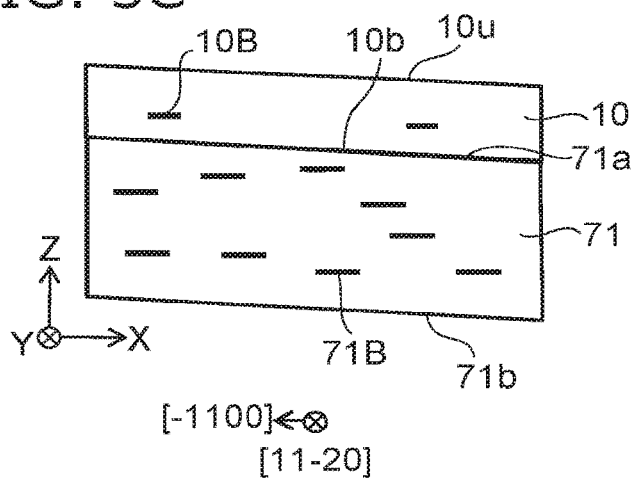

METHOD FOR MANUFACTURING SILICON CARBIDE BASE BODY, METHOD FOR MANUFACTURING SEMICONDUCTOR DEVICE, SILICON CARBIDE BASE BODY, AND SEMICONDUCTOR DEVICE

CROSS-REFERENCE TO RELATED APPLICATIONS

This application is based upon and claims the benefit of priority from Japanese Patent Application No. 2020-002078, filed on Jan. 9, 2020; the entire contents of which are incorporated herein by reference.

FIELD

Embodiments of the invention generally relate to a method for manufacturing a silicon carbide base body, a method for manufacturing a semiconductor device, a silicon carbide base body, and a semiconductor device.

BACKGROUND

For example, there is a semiconductor device that uses a silicon carbide base body. A high-quality silicon carbide base body is desirable.

BRIEF DESCRIPTION OF THE DRAWINGS

FIGS. 3A to 3C are schematic views illustrating a method for manufacturing the silicon carbide base body according to the first embodiment;

DETAILED DESCRIPTION

Figure 1:
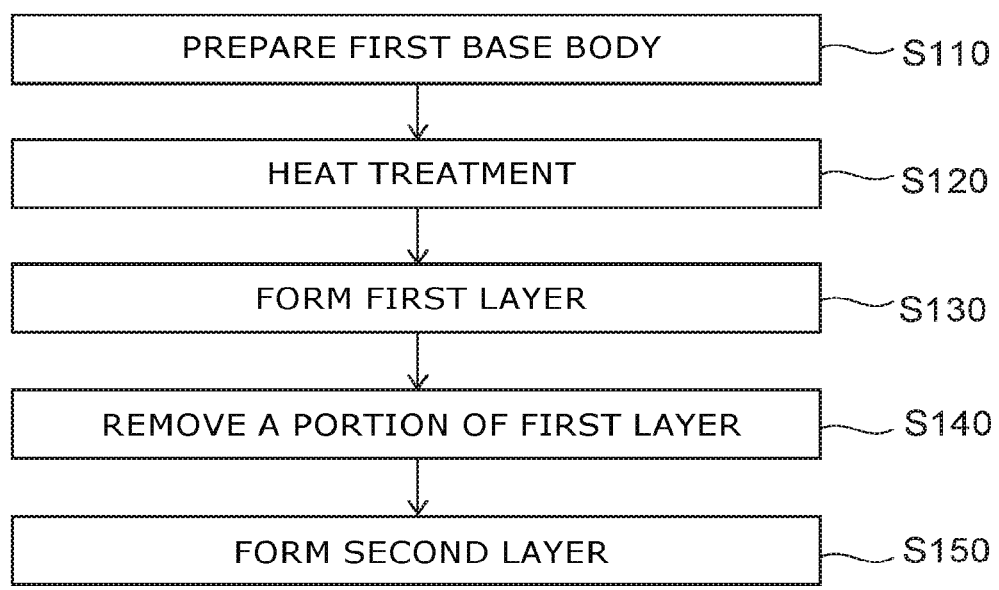
FIG. 1 is a flowchart illustrating a method for manufacturing a silicon carbide base body according to a first embodiment.

According to one embodiment, a method for manufacturing a silicon carbide base body is disclosed. The method can include preparing a first base body. The first base body includes silicon carbide. The first base body includes a first base body surface. The first base body surface is tilted with respect to a (0001) plane of the first base body. A first line segment where the first base body surface and the (0001) plane of the first base body intersect is along a [11-20] direction of the first base body. The method can include forming a first layer at the first base body surface. The first layer includes silicon carbide. The method can include removing a portion of the first layer. A first-layer surface of the first layer is exposed by the removing of the portion. The first-layer surface is tilted with respect to a (0001) plane of the first layer. A second line segment where the first-layer surface and the (0001) plane of the first layer intersect is along a [−1100] direction.

According to one embodiment, a method for manufacturing a semiconductor device is disclosed. The method can include preparing a silicon carbide base body. The silicon carbide base body includes a first base body including silicon carbide. The first base body includes a first base body surface tilted with respect to a (0001) plane of the first base body. A first line segment where the first base body surface and the (0001) plane of the first base body intersect is along a [11-20] direction of the first base body. The silicon carbide base body includes a first layer provided at the first base body surface. The first layer includes silicon carbide. The first layer includes a first-layer surface and a first-layer opposite-surface. The first-layer opposite-surface is between the first base body surface and the first-layer surface. The first-layer surfaces tilted with respect to a (0001) plane of the first layer. A second line segment where the first-layer surface and the (0001) plane of the first layer intersect is along a [−1100] direction. The method can include forming a second layer at the first-layer surface. The second layer includes silicon carbide.

According to one embodiment, a silicon carbide base body includes a first base body and a first layer. The first base body includes silicon carbide. The first base body includes a first base body surface tilted with respect to a (0001) plane of the first base body. A first line segment where the first base body surface and the (0001) plane of the first base body intersect is along a [11-20] direction of the first base body. The first layer is provided at the first base body surface. The first layer includes silicon carbide. The first layer includes a first-layer surface and a first-layer opposite-surface. The first-layer opposite-surface is between the first base body surface and the first-layer surface. The first-layer surface is tilted with respect to a (0001) plane of the first layer. A second line segment where the first-layer surface and the (0001) plane of the first layer intersect is along a [−1100] direction.

According to one embodiment, a semiconductor device includes a first base body, a first layer, and a second layer. The first base body includes silicon carbide. The first base body includes a first base body surface tilted with respect to a (0001) plane of the first base body. A first line segment where the first base body surface and the (0001) plane of the first base body intersect is along a [11-20] direction of the first base body. The first layer is provided at the first base body surface. The first layer includes silicon carbide. The first layer includes a first-layer surface and a first-layer opposite-surface. The first-layer opposite-surface is between the first base body surface and the first-layer surface. The first-layer surface is tilted with respect to a (0001) plane of the first layer. A second line segment where the first-layer surface and the (0001) plane of the first layer intersect is along a [−1100] direction. The second layer is provided at the first-layer surface. The second layer includes silicon carbide.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a flowchart illustrating a method for manufacturing a silicon carbide base body according to a first embodiment.

Figure 4A:
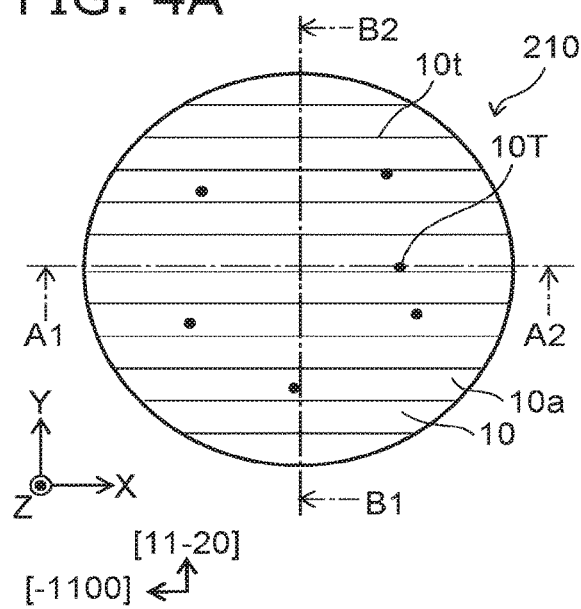
FIGS. 4A to 4D are schematic views illustrating a method for manufacturing the silicon carbide base body according to the first embodiment.

FIGS. 2A to 2D, FIGS. 3A to 3C, FIGS. 4A to 4D, and FIGS. 5A to 5C are schematic views illustrating the method for manufacturing the silicon carbide base body according to the first embodiment. FIGS. 2A, 3A, 4A, and 5A are schematic plan views. FIGS. 2B, 3B, 4B, and 5B correspond to line B1-B2 cross-sectional views respectively of FIGS. 2A, 3A, 4A, and 5A. FIGS. 2C, 3C, 4C, and 5C correspond to line A1-A2 cross-sectional views respectively of FIGS. 2A, 3A, 4A, and 5A. FIGS. 2D and 4D are plan views.

As shown in FIG. 1, the method for manufacturing the silicon carbide base body according to the embodiment includes preparing a first base body (step S110), forming a first layer (step S130), and removing a portion of the first layer (step S140). For example, a thickness of at least a part of the first layer is decreased. In the example, heat treatment is performed between step S110 and step S130 (step S120). As shown in FIG. 1, the formation of a second layer (step S150) may be performed after step S140.

Figure 2A:
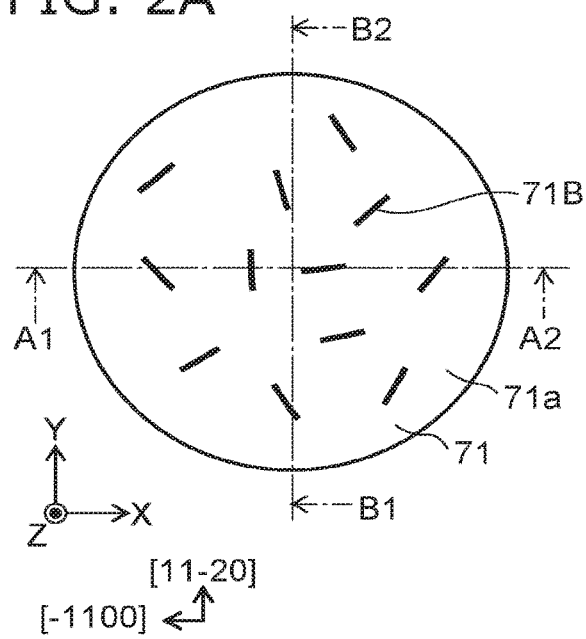
FIGS. 2A to 2D are schematic views illustrating a method for manufacturing the silicon carbide base body according to the first embodiment.
Figure 2B:
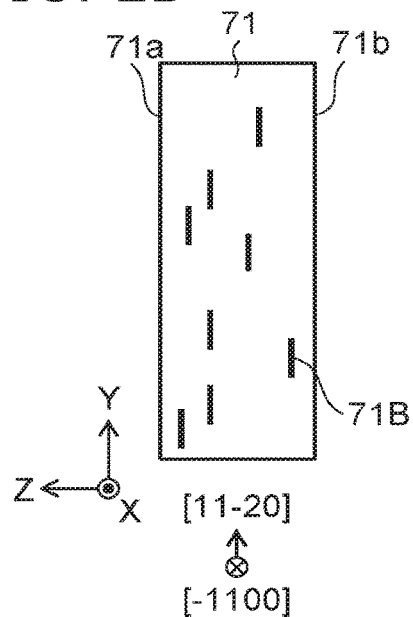
Figure 2C:
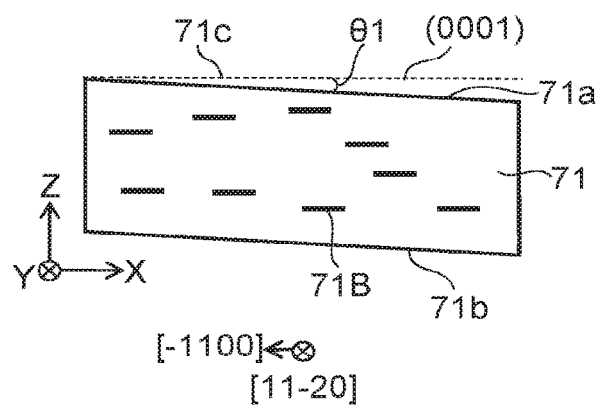
Figure 2D:
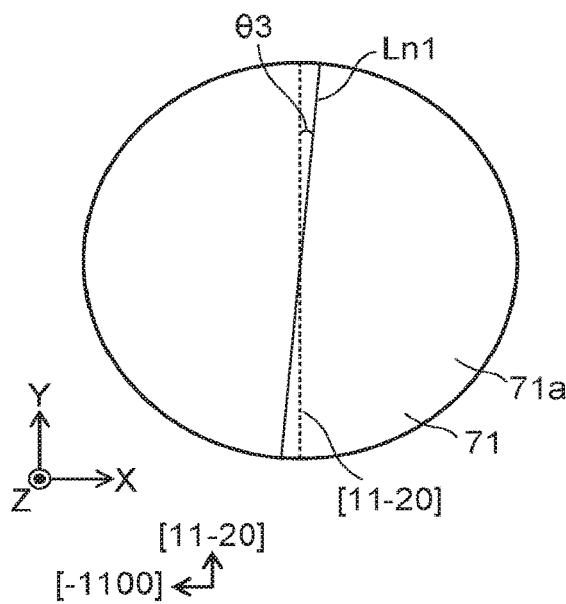

As shown in FIGS. 2A to 2C, a first base body 71 includes a first base body surface 71a. The first base body 71 includes a first base body opposite-surface 71b. The first base body opposite-surface 71b is the surface at the side opposite to the first base body surface 71a. The first base body 71 includes silicon carbide. The first base body 71 is, for example, a silicon carbide wafer. The first base body 71 is, for example, a silicon carbide crystal.

As shown in FIG. 2C, the first base body surface 71a is tilted with respect to a (0001) plane 71c of the first base body 71. The (0001) plane 71c is, for example, a c-plane of the first base body 71. The first base body surface 71a is an off-cut surface.

A first angle θ1 between the first base body surface 71a and the (0001) plane 71c of the first base body 71 (referring to FIG. 2C) is, for example, not less than 2 degrees and not more than 8 degrees. In one example, the first angle θ1 is about 4 degrees. For example, the first base body surface 71a is tilted substantially along a <-1100> direction with respect to the (0001) plane 71c of the first base body 71. In the embodiment, the tilt direction may slightly deviate from the <-1100> direction.

For example, as shown in FIG. 2D, the first base body surface 71a and the (0001) plane 71c of the first base body 71 intersect at a first line segment Ln1. The first line segment Ln1 where the first base body surface 71a and the (0001) plane 71c of the first base body 71 intersect is along a [11-20] direction of the first base body 71.

In the notation of "<-1100>", the "-" means that the numeral after the "-" is marked with a "bar". For example, in the notation of "[11-20]", the "-" means that the numeral after the "-" is marked with a "bar".

In the embodiment, the first line segment Ln1 may not be exactly parallel to the [11-20] direction of the first base body 71. The angle (a third angle θ3) between the first line segment Ln1 and the [11-20] direction of the first base body 71 is, for example, ±5 degrees or less.

As shown in FIGS. 2A to 2D, a direction perpendicular to the (0001) plane 71c is taken as a Z-axis direction. One direction perpendicular to the Z-axis direction is taken as an X-axis direction. A direction perpendicular to the Z-axis direction and the X-axis direction is taken as a Y-axis direction. For example, the [11-20] direction is along the Y-axis direction. The [-1100] direction is along the X-axis direction.

Thus, an off-cut first base body 71 is prepared. The method for manufacturing the silicon carbide base body according to the embodiment may include forming the first base body 71. For example, the first base body 71 can be formed by preparing a silicon carbide crystal used to form the first base body 71 and by performing an off-cut.

The first base body opposite-surface 71b of the first base body 71 also may be tilted with respect to the (0001) plane 71c. The first base body opposite-surface 71b may be substantially parallel to the first base body surface 71a. For example, when the first base body surface 71a that is tilted from the crystal axis is obtained by polishing, etc., a stable tilt angle is easily obtained when the first base body opposite-surface 71b is substantially parallel to the first base body surface 71a.

As shown in FIGS. 2A to 2C, basal plane dislocations 71B (BPDs) exist in the first base body 71. As shown in FIG. 2A, the basal plane dislocations 71B are oriented in various directions in the first base body 71.

In one example as described above, heat treatment of the first base body 71 (step S120) is performed before the formation of the first layer (step S130). The temperature of the heat treatment is, for example, not less than 1100° C. and not more than 1600° C. The time of the heat treatment is, for example, 10 minutes or more. The atmosphere of the heat treatment includes, for example, at least one selected from the group consisting of argon, helium, neon, and nitrogen.

In the embodiment, the first base body 71 on which such heat treatment is performed may be prepared. The first layer is formed after the heat treatment (step S130).

As shown in FIGS. 3A to 3C, the first layer 10 that includes silicon carbide is formed at the first base body surface 71a. For example, the formation of the first layer 10 includes forming the first layer 10 by at least one of sublimation or chemical vapor deposition. For example, the formation of the first layer 10 includes forming at least a portion of the first layer 10 by step-flow growth.

As shown in FIG. 3C, the first layer 10 includes an upper surface 10u and a first-layer opposite-surface 10b. The first-layer opposite-surface 10b is between the first base body 71 and the upper surface 10u. The first-layer opposite-surface 10b faces the first base body surface 71a of the first base body 71. For example, the first-layer opposite-surface 10b contacts the first base body surface 71a. The first-layer opposite-surface 10b is, for example, the lower surface of the first layer 10.

In the state shown in FIG. 3C, the upper surface 10u is substantially parallel to the first base body surface 71a.

As shown in FIG. 3A, for example, step surfaces 10s are formed in the upper surface 10u. The step surfaces 10s are along a [11-20] direction based on the tilted first base body surface 71a.

As shown in FIG. 3A, the first layer 10 includes basal plane dislocations 10B (BPDs). The basal plane dislocations 10B are substantially perpendicular to the step surfaces 10s.

For example, the basal plane dislocations 10B of the first layer 10 are substantially along the [−1100] direction. The [11-20] direction components of the basal plane dislocations 10B of the first layer 10 are small. The [11-20] direction components of the basal plane dislocations 10B of the first layer 10 are smaller than the [11-20] direction components of the basal plane dislocations 71B (referring to FIG. 2A) of the first base body 71.

For example, it is considered that such basal plane dislocations 10B are obtained by a propagation force perpendicular to the steps acting on the basal plane dislocations 10B when the first layer 10 grows on the first base body surface 71a tilted in the [−1100] direction. Examples of the basal plane dislocations 10B are described below.

A portion of such a first layer 10 is removed (step S140). For example, the removal of the portion of the first layer 10 is performed by polishing, etc. The removal may include polishing. As described below, the removal of the portion of the first layer 10 corresponds to performing an off-cut.

FIGS. 4A to 4D illustrate a state after removing the portion of the first layer 10. A first-layer surface 10a of the first layer 10 is exposed by the removal of the portion of the first layer 10.

Figure 4B:
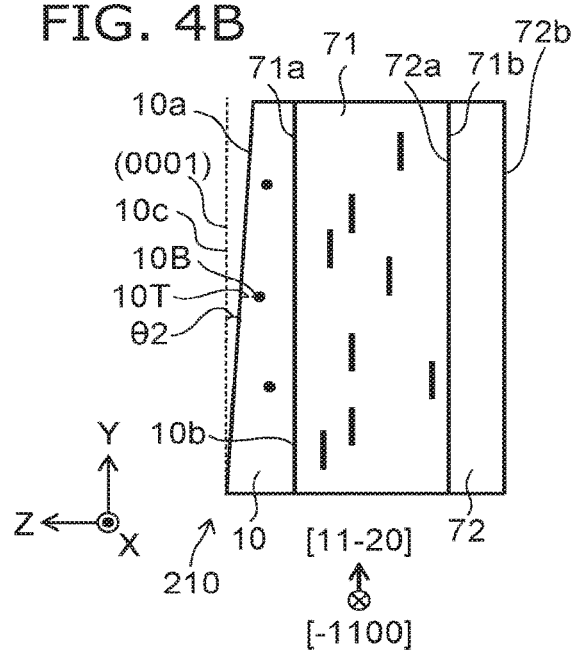

As shown in FIG. 4B, the exposed first-layer surface 10a is tilted with respect to a (0001) plane 10c of the first layer 10. The (0001) plane 10c of the first layer 10 is substantially parallel to the (0001) plane 71c of the first base body 71 (referring to FIG. 2C).

A second angle θ2 between the (0001) plane 10c and the first-layer surface 10a of the first layer 10 (referring to FIG. 4B) is, for example, not less than 2 degrees and not more than 8 degrees. In one example, the second angle θ2 is about 4 degrees. For example, the first-layer surface 10a is tilted substantially along a <11-20> direction with respect to the (0001) plane 10c of the first layer 10. In the embodiment, the tilt direction may slightly deviate from the <11-20> direction.

For example, as shown in FIG. 4D, the (0001) plane 10c and the first-layer surface 10a of the first layer 10 intersect at a second line segment Ln2. The second line segment Ln2 where the (0001) plane 10c and the first-layer surface 10a of the first layer 10 intersect is along the [−1100] direction.

In the embodiment, the second line segment Ln2 may not be exactly parallel to the [−1100] direction of the first base body 71. A fourth angle θ4 between the second line segment Ln2 and the [−1100] direction of the first layer 10 is ±5 degrees or less.

The [−1100] direction of the first layer 10 is along the [−1100] direction of the first base body 71. The [11-20] direction of the first layer 10 is along the [11-20] direction of the first base body 71.

A silicon carbide base body 210 illustrated in FIGS. 4A to 4D is obtained. As shown in FIG. 4A, step surfaces 10t are formed in the first-layer surface 10a by the first-layer surface 10a being tilted from the (0001) plane. The step surfaces 10t are along the [−1100] direction.

At such step surfaces 10t, the basal plane dislocations 10B change into threading edge dislocations 10T when silicon carbide is grown. The threading edge dislocations 10T extend from the first layer 10 to a second-layer surface 20a of a second layer 20. The basal plane dislocations 10B are reduced by the basal plane dislocations 10B changing into the threading edge dislocations 10T. According to the embodiment, the density of the basal plane dislocations 10B can be reduced.

For example, when a high current density such as a surge current or the like occurs, the injected holes cause stacking faults to expand from the basal plane dislocations as starting points. The forward voltage is shifted thereby.

According to the embodiment, the basal plane dislocations can be reduced. Thereby, the expansion of the stacking faults can be suppressed, and the forward-direction characteristic degradation can be suppressed. A high-quality silicon carbide base body is obtained.

Figure 5A:
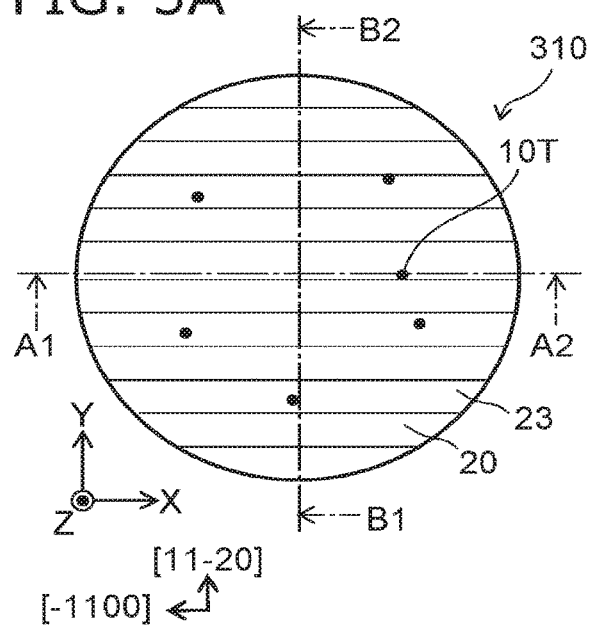
FIGS. 5A to 5C are schematic views illustrating a method for manufacturing the silicon carbide base body according to the first embodiment.
Figure 5B:
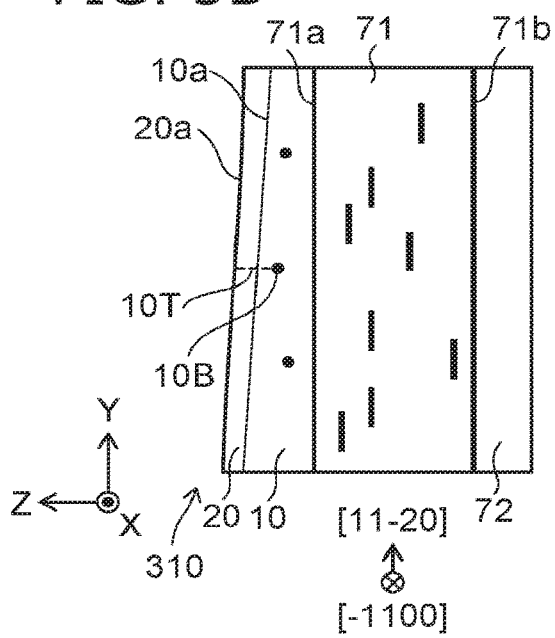
Figure 5C:
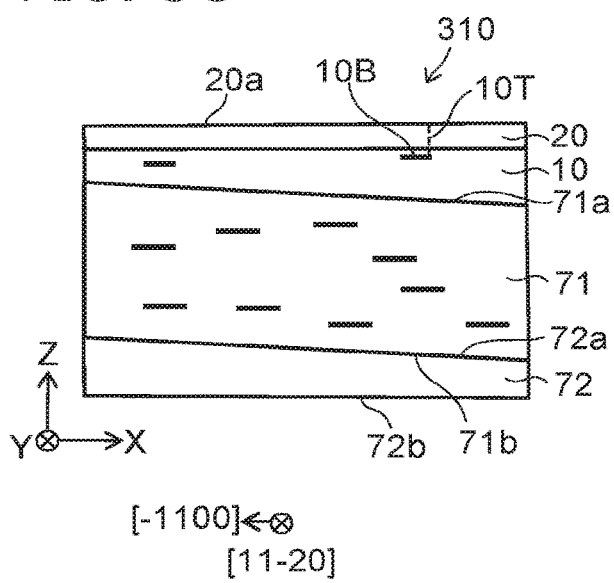

As shown in FIGS. 5A to 5C, the method for manufacturing the silicon carbide base body according to the embodiment may include forming the second layer 20. The second layer 20 includes silicon carbide. The second layer 20 is formed at the first-layer surface 10a. As shown in FIGS. 5A to 5C, basal plane dislocations substantially do not exist in the second layer 20 formed on a first layer 10 such as that described above. The basal plane dislocations 10B along the [−1100] direction of the first layer 10 change into the threading edge dislocations 10T. The threading edge dislocations 10T are substantially along the Z-axis direction. The density of the basal plane dislocations 10B is effectively reduced by the basal plane dislocations 10B changing into the threading edge dislocations 10T. Thus, the second layer 20 includes the threading edge dislocations 10T connected to the basal plane dislocations 10B included in the first layer 10.

Thus, a semiconductor device 310 according to the embodiment is obtained. The semiconductor device 310 includes the silicon carbide base body 210 (referring to FIGS. 4A to 4D) and the second layer 20.

According to the embodiment, the expansion of the stacking faults can be suppressed, and stable characteristics are obtained.

Figure 6A:
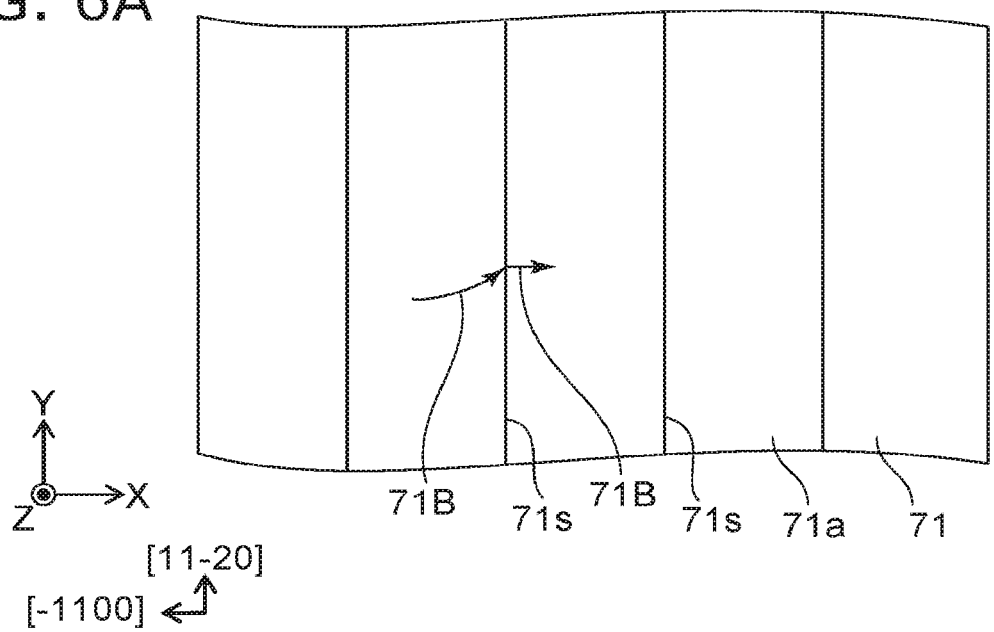
FIGS. 6A and 6B are schematic views illustrating the method for manufacturing the silicon carbide base body according to the first embodiment.
Figure 6B:
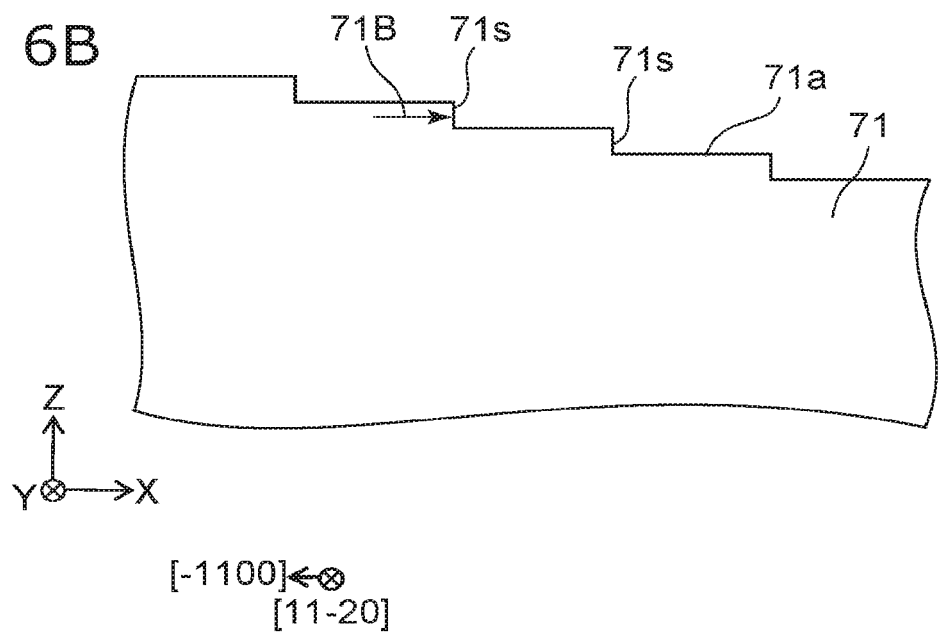

FIGS. 6A and 6B are schematic views illustrating the method for manufacturing the silicon carbide base body according to the first embodiment.

These drawings illustrate the basal plane dislocations 71B in the heat treatment of the first base body 71 (step S120). FIG. 6A is a plan view. FIG. 6B is a cross-sectional view.

As shown in FIGS. 6A and 6B, step surfaces 71s are formed in the first base body surface 71a of the first base body 71. The step surfaces 71s are along the [11-20] direction based on the tilted first base body surface 71a. The step surfaces 71s are along the m-plane of the first base body 71.

When heat treatment of the first base body 71 including such step surfaces 71s is performed, a large image force acts on the basal plane dislocations 71B having [11-20] direction components. As a result, the basal plane dislocations 71B easily become perpendicular to the m-plane of the first base body 71.

Thereby, the [11-20] direction components of the basal plane dislocations 71B are reduced, and the basal plane dislocations 71B become aligned with the [−1100] direction.

For example, the density of the basal plane dislocations 71B along the [11-20] direction in the first base body surface 71a can be substantially zero.

When the first layer 10 described above is formed on such a first base body surface 71a, the [11-20] direction basal plane dislocations are substantially not formed in the first layer 10. The basal plane dislocations 10B along the [−1100] direction (referring to FIG. 3A) are formed in the first layer 10. The basal plane dislocations 10B along the [−1100] direction can be easily changed into the threading edge dislocations 10T.

Figure 7A:
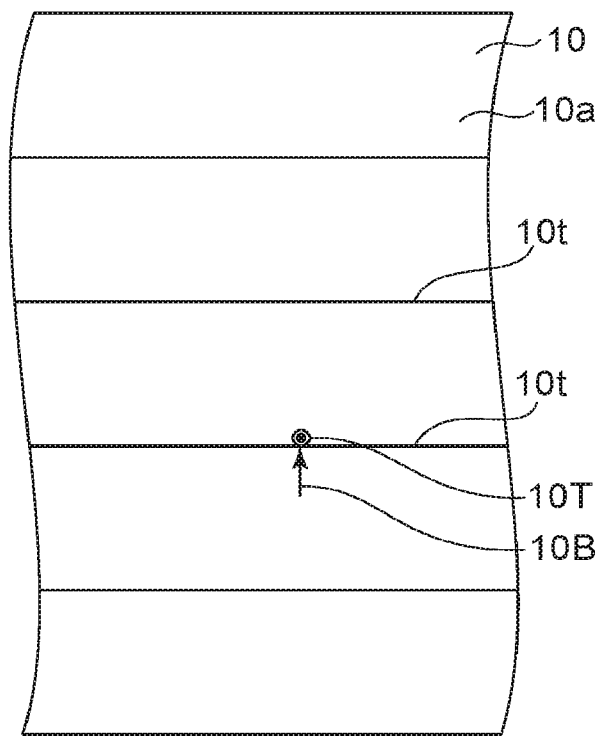
FIGS. 7A and 7B are schematic views illustrating the method for manufacturing the silicon carbide base body according to the first embodiment.
Figure 7B:
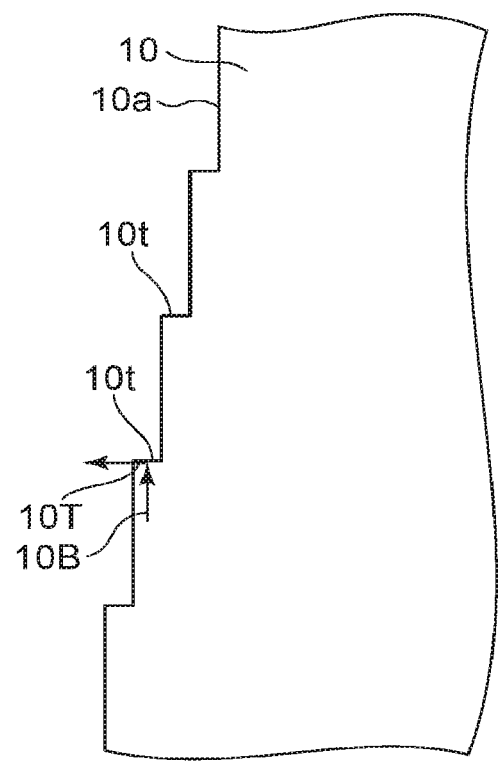

FIGS. 7A and 7B are schematic views illustrating the method for manufacturing the silicon carbide base body according to the first embodiment.

These drawings illustrate the first layer 10. FIG. 7A is a plan view. FIG. 7B is a cross-sectional view.

As shown in FIGS. 7A and 7B, the step surfaces 10t are formed in the first-layer surface 10a of the first layer 10. The step surfaces 10t are along the [11-20] direction based on the tilted first-layer surface 10a. The step surfaces 10t are along the a-plane of the first layer 10. The basal plane dislocations 10B are substantially perpendicular to the step surfaces 10t.

For example, the basal plane dislocations 10B can easily change into the threading edge dislocations 10T due to the temperature increase when the second layer 20 is formed on such step surfaces 10t. The density of the basal plane dislocations 10B can be reduced thereby.

In the embodiment, for example, the first base body 71 is prepared so that the surface is off-cut in the [−1100] direction from the (0001) plane. The first base body 71 is, for example, a bulk crystal. Heat treatment of such a first base body 71 is performed at a prescribed temperature for a prescribed amount of time. The first layer 10 is formed by step-flow by sublimation or high temperature CVD using the first base body 71 as a seed crystal. The first layer 10 is off-cut in the [11-20] direction.

m-plane steps are formed by the off-cut in the [−1100] direction. The maximum image force acts on the basal plane dislocations that are along the [11-20] direction. Heat treatment is performed in this state. Thereby, the basal plane dislocations are changed into threading edge dislocations at deep positions.

Thereby, the density of the basal plane dislocations in the [11-20] direction at the surface of the first base body 71 can be substantially zero. The first layer 10 is formed by step-flow growth on such a first base body 71. The first layer 10 may be a high-concentration doped layer. The first layer 10 is off-cut in the [11-20] direction. The a-plane steps are formed in the surface of the first layer 10. The basal plane dislocations in the first layer 10 are along the [−1100] direction. Subsequently, the basal plane dislocations that are in the [−1100] direction are changed into threading edge dislocations at deep positions when the temperature increases when growing the second layer 20, etc.

For example, basal plane dislocations that are oriented in random directions in the basal plane of a bulk substrate (a wafer) easily exist parallel to the surface of the wafer when the wafer is cut substantially along the (0001) plane. When a silicon carbide layer is epitaxially grown on the bulk substrate in this state, many of the basal plane dislocations are converted into threading edge dislocations at the vicinity of the interface between the bulk substrate and the silicon carbide layer. At this time, by presetting the off-cut direction to the [11-20] direction, the conversion rate into threading edge dislocations of the basal plane dislocations along the [11-20] direction is low. Therefore, the basal plane dislocations are easily inherited by the epitaxial layer. It is considered that this phenomenon is based on the image force and the force of the dislocations propagating perpendicular to the steps.

In the embodiment, the tilt direction is different between the first base body 71 and the first layer 10. Thereby, the basal plane dislocations that are oriented in random directions become oriented in the [−1100] direction, and the basal plane dislocations that are oriented in the [−1100] direction are changed into threading edge dislocations with a high efficiency. The density of the basal plane dislocations can be efficiently decreased. In the embodiment, a portion of the first layer 10 is removed. The first layer 10 covers the first base body surface 71a of the first base body 71 even after the portion is removed. A thickness t1 of the first layer 10 that is formed (referring to FIG. 3B) is set so that the first layer 10 covers the first base body surface 71a even after the portion of the first layer 10 is removed.

As shown in FIG. 3B, the length of the first base body 71 along the [11-20] direction of the first base body 71 is taken as a length L1. The thickness of the first layer 10 along a direction perpendicular to the (0001) plane 71c of the first base body 71 (the X-Y plane) before the removing of the portion of the first layer 10 is taken as the thickness t1. The thickness t1 of the first layer 10 is greater than $(\tan\theta 2) \times L1$. As described above, the second angle $\theta 2$ is the angle between the (0001) plane 10c and the first-layer surface 10a of the first layer 10.

Figure 8A:
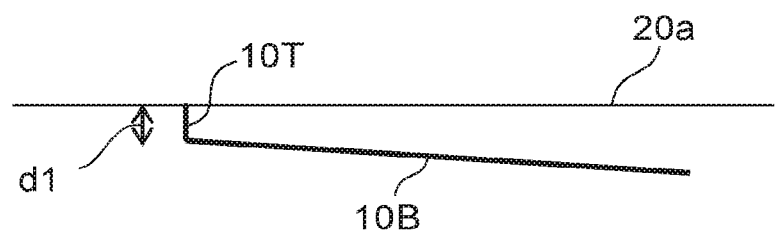
FIGS. 8A and 8B are schematic cross-sectional views illustrating the method for manufacturing the silicon carbide base body according to the first embodiment.
Figure 8B:
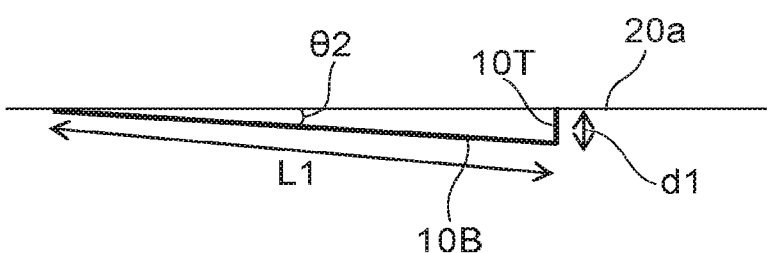

FIGS. 8A and 8B are schematic cross-sectional views illustrating the method for manufacturing the silicon carbide base body according to the first embodiment.

As shown in FIG. 8A, the basal plane dislocation 10B changes into the threading edge dislocation 10T. The depth of the threading edge dislocation 10T is taken as a depth d1. As shown in FIG. 8B, a length L1 of the basal plane dislocation 10B is represented by $d1)(\sin\theta 2)$.

The magnitude of the image force acting on the basal plane dislocation in the [11-20] direction is proportional to L1/d1. Accordingly, by forming the m-plane steps, the basal plane dislocations 10B in the [11-20] direction are easily changed efficiently into the threading edge dislocations 10T.

Figure 9:
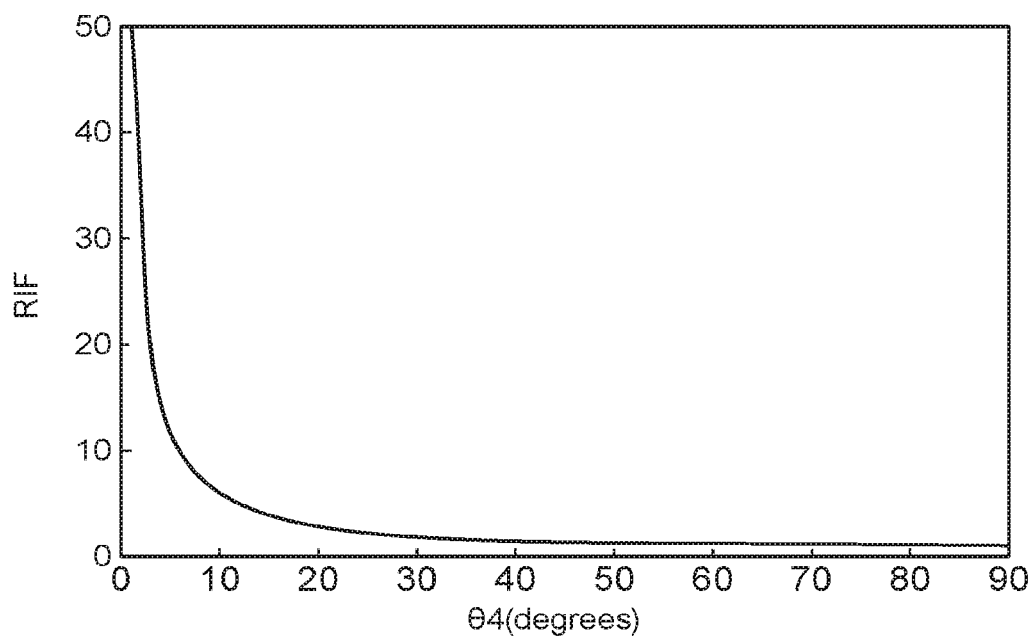
FIG. 9 is a graph illustrating a characteristic of the silicon carbide base body according to the first embodiment.

FIG. 9 is a graph illustrating a characteristic of the silicon carbide base body according to the first embodiment.

FIG. 9 is a graph for describing an example of an action relating to the first embodiment. The horizontal axis of FIG. 9 is the fourth angle $\theta 4$ (referring to FIG. 4D). The fourth angle $\theta 4$ corresponds to the magnitude of the clockwise rotation angle from the [−1100] direction toward the [11-20] direction. The vertical axis of FIG. 9 is an image force intensity RIF (a relative value) acting on the basal plane dislocation 71B in the [11-20] direction.

As shown in FIG. 9, the image force intensity RIF is large when the fourth angle $\theta 4$ is small. In the embodiment, it is favorable for the absolute value of the fourth angle $\theta 4$ to be 5 degrees or less. A large image force is obtained thereby.

Thereby, the basal plane dislocations 10B are easily changed into the threading edge dislocations 10T.

It is favorable for the absolute value of the third angle $\theta 3$ to be 5 degrees or less. Thereby, the basal plane dislocations 71B that are oriented in various directions in the first base body 71 are easily aligned with the [−1100] direction.

As shown in FIGS. 5B and 5C, the silicon carbide base body 210 or the semiconductor device 310 may include a second base body 72 in addition to the first base body 71, the first layer 10, and the second layer 20. The second base body 72 includes, for example, graphite, etc.

The first base body 71 is between the second base body 72 and the first layer 10. As shown in FIG. 5C, the second base body 72 includes a second base body surface 72a and a second base body opposite-surface 72b. The second base body surface 72a is between the second base body opposite-surface 72b and the first base body 71. The second base body surface 72a faces the first base body 71.

For example, the second base body opposite-surface 72b is along the X-Y plane. For example, the second base body opposite-surface 72b is along the (0001) plane 71c of the first base body 71 (referring to FIG. 2C).

For example, the angle between the second base body opposite-surface 72b and the (0001) plane 71c (the X-Y plane) of the first base body 71 is substantially zero. This angle is, for example, less than the angle (the first angle θ1) between the first base body surface 71a and the (0001) plane 71c of the first base body 71 and less than the angle (the second angle θ2) between the first-layer surface 10a and the (0001) plane 71c (the X-Y plane) of the first base body 71.

By providing such a second base body 72, the tilt of the first layer 10 is easy to obtain stably with high precision.

Second Embodiment

A second embodiment relates to a method for manufacturing a semiconductor device. In the embodiment, the method for manufacturing the semiconductor device includes step S110, step S130, step S140, and step S150 described above (referring to FIG. 1). The method for manufacturing the semiconductor device may include step S120. Or, the first base body 71 after step S120 is performed may be prepared in step S110. In the embodiment, the second layer 20 includes the threading edge dislocations 10T connected to the basal plane dislocations 10B included in the first layer 10. By changing the basal plane dislocations 10B into the threading edge dislocations 10T, the density of the basal plane dislocations 10B can be reduced.

According to the method for manufacturing the semiconductor device, the density of the basal plane dislocations 10B can be reduced. According to the embodiment, a method for manufacturing a high-quality semiconductor device can be provided.

Third Embodiment

A third embodiment relates to the silicon carbide base body 210 (referring to FIGS. 4A to 4D).

Figure 4C:
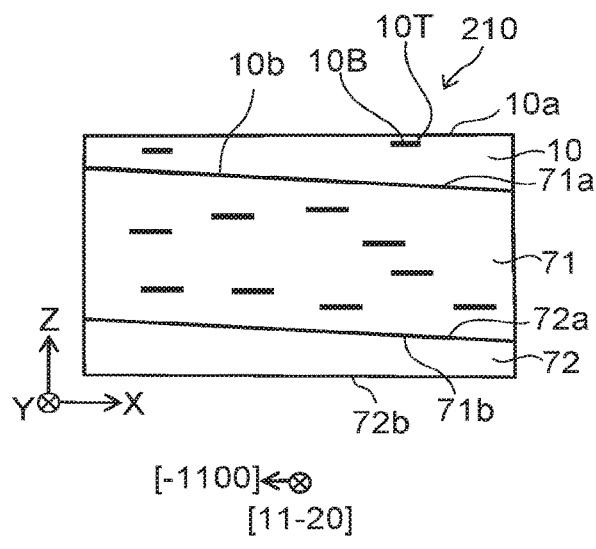
Figure 4D:
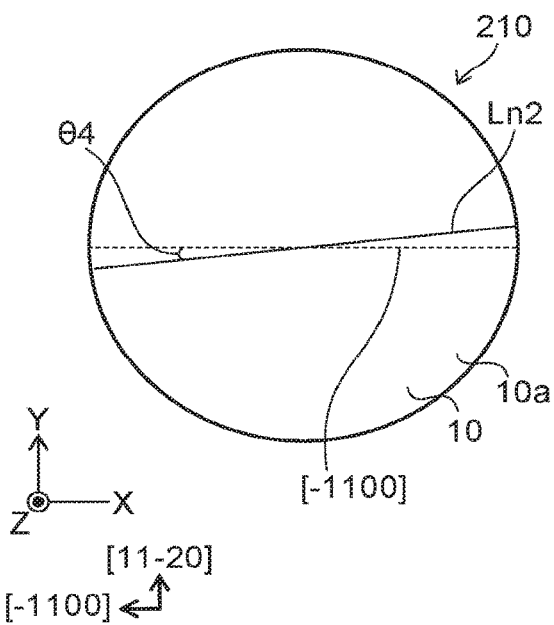

As shown in FIGS. 4A to 4C, the silicon carbide base body 210 includes the first base body 71 and the first layer 10.

The first base body 71 includes the first base body surface 71a and includes silicon carbide. As shown in FIG. 2C, the first base body surface 71a is tilted with respect to the (0001) plane 71c of the first base body 71. As shown in FIG. 2D, the first line segment Ln1 where the first base body surface 71a and the (0001) plane 71c of the first base body 71 intersect is along the [11-20] direction of the first base body 71.

As shown in FIG. 4B, the first layer 10 is provided in the first base body surface 71a and includes silicon carbide. The first layer 10 includes the first-layer surface 10a and the first-layer opposite-surface 10b. The first-layer opposite-surface 10b is between the first base body surface 71a and the first-layer surface 10a. The first-layer opposite-surface 10b faces the first base body surface 71a. The first-layer surface 10a is tilted with respect to the (0001) plane 10c of the first layer 10. As shown in FIG. 4D, the second line segment Ln2 where the (0001) plane 10c and the first-layer surface 10a of the first layer 10 intersect is along the [−1100] direction.

According to the silicon carbide base body 210 according to the embodiment, the density of the basal plane dislocations in a silicon carbide layer (e.g., the second layer 20) formed at the silicon carbide base body 210 can be reduced. A silicon carbide base body is obtained on which the high-quality silicon carbide crystal can be grown.

Fourth Embodiment

A fourth embodiment relates to a semiconductor device (e.g., the semiconductor device 310). As shown in FIGS. 5A to 5C, the semiconductor device 310 includes the first base body 71, the first layer 10, and the second layer 20. The density of the basal plane dislocations in the semiconductor device 310 can be reduced. A high-quality semiconductor device is obtained.

Figure 10:
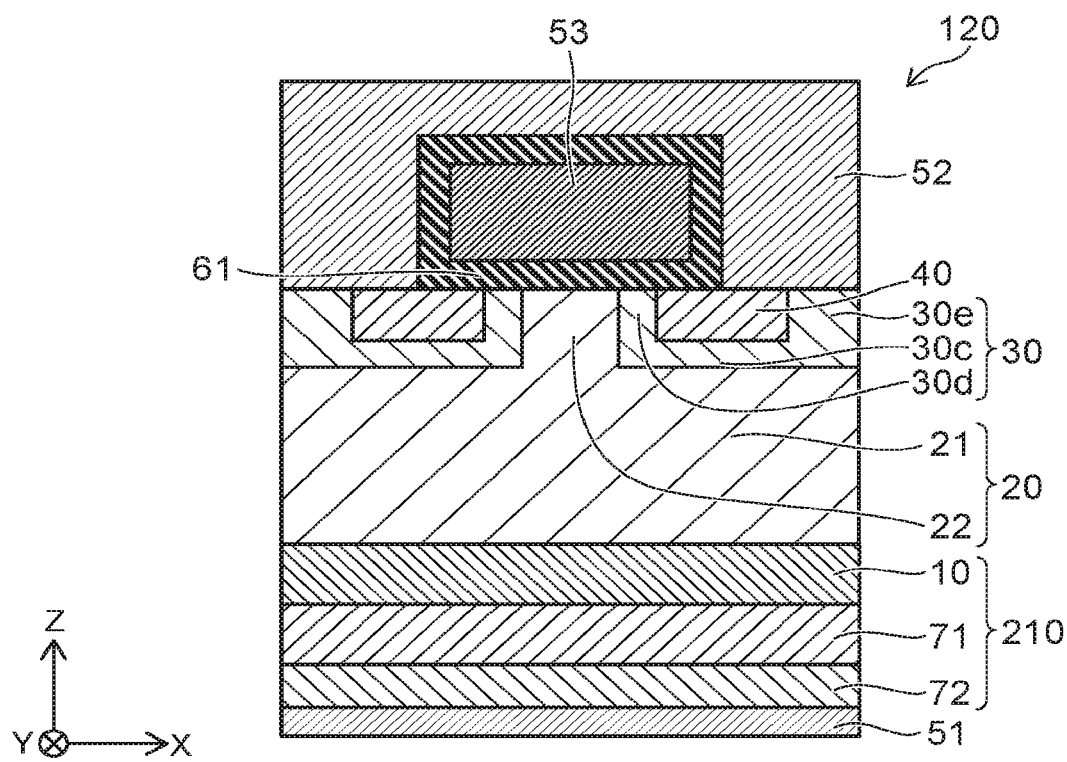
FIG. 10 is a schematic cross-sectional view illustrating a semiconductor device according to a fourth embodiment.

FIG. 10 is a schematic cross-sectional view illustrating a semiconductor device according to a fourth embodiment.

As shown in FIG. 10, the semiconductor device 120 includes the first base body 71, the first layer 10, and the second layer 20. In the example, the semiconductor device 120 includes a third layer 30, a fourth layer 40, the second base body 72, a first electrode 51, a second electrode 52, a third electrode 53, and an insulating portion 61.

The third layer 30 and the fourth layer 40 include silicon carbide. For example, the first layer 10 is of the n-type. The second layer 20 is of the n-type. The third layer 30 is of the p-type. The fourth layer 40 is of the n-type. The second layer 20 is between the first layer 10 and the third layer 30.

The first electrode 51 is electrically connected to the first layer 10. The second electrode 52 is electrically connected to the third layer 30.

The second layer 20 is, for example, a drift layer. The second layer 20 includes a first partial region 21 and a second partial region 22. The direction from the second partial region 22 toward the first partial region 21 intersects the Z-axis direction.

A portion of the third layer 30 is between the first partial region 21 and the fourth layer 40 in the Z-axis direction. The third layer 30 includes a third partial region 30c, a fourth partial region 30d, and a fifth partial region 30e. The third partial region 30c is between the fourth layer 40 and the first partial region 21 in the Z-axis direction. The fourth layer 40 is between the second partial region 22 and the fifth partial region 30e in a direction intersecting the Z-axis direction. The fourth partial region 30d is between the second partial region 22 and the fourth layer 40 in a direction (e.g., the X-axis direction) intersecting the Z-axis direction.

The direction from the second partial region 22 toward the third electrode 53 is along the Z-axis direction. At least a portion of the insulating portion 61 is between the second partial region 22 and the third electrode 53.

The first electrode 51 is, for example, a drain electrode. The second electrode 52 is, for example, a source electrode. The third electrode 53 is, for example, a gate electrode. The insulating portion 61 is, for example, a gate insulating film. The semiconductor device 120 is a MOSFET when the first layer 10 is of the n-type. The semiconductor device 120 is, for example, an IGBT (Insulated Gate Bipolar Transistor) when the first layer 10 is of the p-type.

Figure 11:
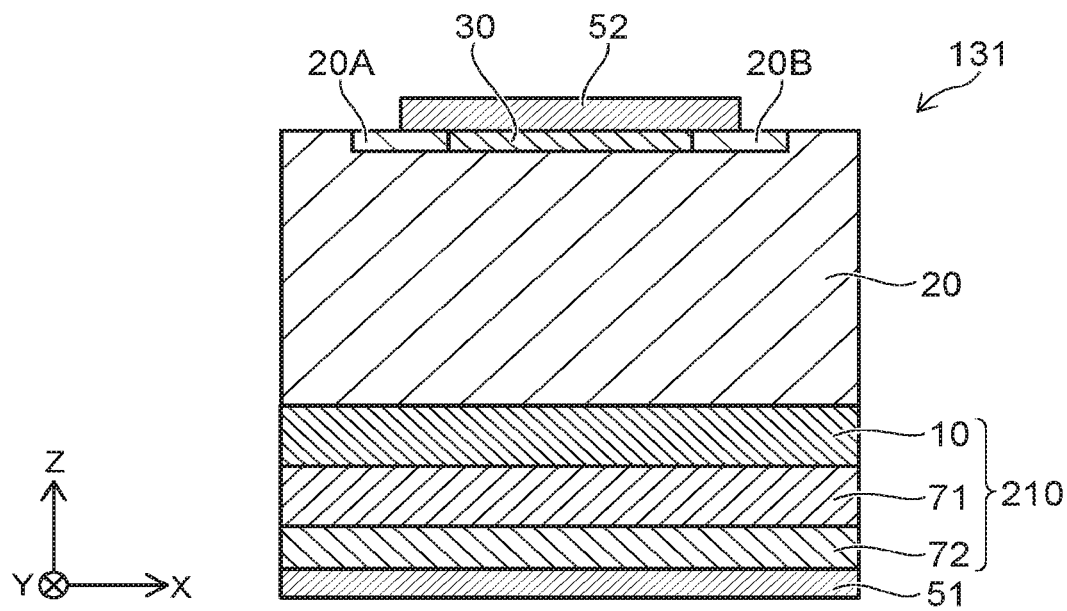
FIG. 11 is a schematic cross-sectional view illustrating a semiconductor device according to a fourth embodiment.

FIG. 11 is a schematic cross-sectional view illustrating a semiconductor device according to the fourth embodiment.

As shown in FIG. 11, the semiconductor device 131 according to the embodiment includes the first base body 71, the first layer 10, the second layer 20, the third layer 30, the first electrode 51, and the second electrode 52. The semiconductor device 131 is a p-n junction diode.

In the example, a junction terminal region 20A is provided between the second layer 20 and one end portion of the second electrode 52. A junction terminal region 20B is provided between the second layer 20 and another end portion of the second electrode 52. The first electrode 51 is, for example, a cathode electrode. The second electrode 52 is, for example, an anode electrode.

The expansion of stacking faults is suppressed in the semiconductor device according to the embodiment (e.g., the semiconductor devices 120, 131, etc.). For example, a stable forward voltage Vf is obtained. According to the embodiment, a high-quality semiconductor device can be provided.

In the embodiment, at least one of the first electrode 51 or the second electrode 52 includes, for example, at least one selected from the group consisting of Al, Cu, and Au. For example, the third electrode 53 (e.g., the gate electrode) includes at least one selected from the group consisting of TiN, Al, Ru, W, and TaSiN. The insulating portion 61 includes, for example, at least one selected from the group consisting of silicon oxide, silicon nitride, silicon oxynitride, aluminum oxide, and hafnium oxide.

In the embodiment, information that relates to the crystal orientation is obtained by, for example, X-ray diffraction analysis, etc. Information that relates to the basal plane dislocations and the threading edge dislocations is obtained by, for example, at least one of X-ray topography or photoluminescence imaging.

According to the embodiments, a method for manufacturing a silicon carbide base body, a method for manufacturing a semiconductor device, a silicon carbide base body, and a semiconductor device that have high-quality can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in silicon carbide base bodies and semiconductor devices such as first base bodies, second base bodies, first layers, second layers, electrodes, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all methods for manufacturing silicon carbide base bodies, methods for manufacturing semiconductor devices, silicon carbide base bodies, and semiconductor devices practicable by an appropriate design modification by one skilled in the art based on the methods for manufacturing silicon carbide base bodies, the methods for manufacturing semiconductor devices, the silicon carbide base bodies, and the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a silicon carbide base body, the method comprising:
preparing a first base body including silicon carbide, the first base body including a first base body surface tilted with respect to a (0001) plane of the first base body so that a first line segment where the first base body surface and the (0001) plane of the first base body intersect is along a [11-20] direction of the first base body;
forming a first layer at the first base body surface, the first layer including silicon carbide; and
removing a portion of the first layer,
a first-layer surface of the first layer being exposed by the removing of the portion,
the first-layer surface being tilted with respect to a (0001) plane of the first layer so that a second line segment where the first-layer surface and the (0001) plane of the first layer intersect is along a [-1100] direction.

2. The method according to claim 1, wherein
the first base body surface is tilted in a <-1100> direction with respect to the (0001) plane of the first base body.

3. The method according to claim 1, wherein
a third angle between the first line segment and the [11-20] direction of the first base body is ±5 degrees or less.

4. The method according to claim 1, wherein
a first angle between the first base body surface and the (0001) plane of the first base body is not less than 2 degrees and not more than 8 degrees.

5. The method according to claim 1, wherein
the first-layer surface is tilted in a <11-20> direction with respect to the (0001) plane of the first base body.

6. The method according to claim 1, wherein
a fourth angle between the second line segment and the [-1100] direction of the first layer is ±5 degrees or less.

7. The method according to claim 1, wherein
a second angle θ2 between the first-layer surface and the (0001) plane of the first layer is not less than 2 degrees and not more than 8 degrees.

8. The method according to claim 7, wherein
a thickness of the first layer along a direction perpendicular to the (0001) plane of the first base body before the removing of the portion of the first layer is greater than (tanθ2)×L1, and
L1 is a length of the first base body along the [11-20] direction of the first base body.

9. The method according to claim 1, wherein
heat treatment of the first base body is performed before the forming of the first layer.

10. The method according to claim 9, wherein
a temperature of the heat treatment is not less than 1100° C. and not more than 1600° C., and
a time of the heat treatment is 10 minutes or more.

11. The method according to claim 9, wherein
an atmosphere of the heat treatment includes at least one selected from the group consisting of argon, helium, neon, and nitrogen.

12. The method according to claim 1, wherein
the forming of the first layer includes forming the first layer by at least one of sublimation or chemical vapor deposition.

13. The method according to claim 1, wherein
the forming of the first layer includes forming at least a portion of the first layer by step-flow growth.

14. A method for manufacturing a semiconductor device, the method comprising:
preparing a silicon carbide base body, the silicon carbide base body including
a first base body including silicon carbide, the first base body including a first base body surface tilted with respect to a (0001) plane of the first base body so that a first line segment where the first base body surface and the (0001) plane of the first base body intersect is along a [11-20] direction of the first base body, and
a first layer provided at the first base body surface, the first layer including silicon carbide and including a first-layer surface and a first-layer opposite-surface, the first-layer opposite-surface being between the first base body surface and the first-layer surface, the first-layer surface being tilted with respect to a (0001) plane of the first layer so that a second line segment where the first-layer surface and the (0001) plane of the first layer intersect is along a [−1100] direction; and
forming a second layer at the first-layer surface, the second layer including silicon carbide.

15. The method according to claim 14, wherein
the second layer includes a threading edge dislocation connected to a basal plane dislocation included in the first layer.

16. A silicon carbide base body, comprising:
a first base body including silicon carbide, the first base body including a first base body surface tilted with respect to a (0001) plane of the first base body so that a first line segment where the first base body surface and the (0001) plane of the first base body intersect is along a [11-20] direction of the first base body; and
a first layer provided at the first base body surface, the first layer including silicon carbide and including a first-layer surface and a first-layer opposite-surface, the first-layer opposite-surface being between the first base body surface and the first-layer surface, the first-layer surface being tilted with respect to a (0001) plane of the first layer so that a second line segment where the first-layer surface and the (0001) plane of the first layer intersect is along a [−1100] direction.

17. The silicon carbide base body according to claim 16, further comprising:
a second base body,
the first base body being between the second base body and the first layer,
the second base body including a second base body surface and a second base body opposite-surface,
the second base body surface being between the second base body opposite-surface and the first base body,
an angle between the second base body opposite-surface and the (0001) plane of the first base body being less than an angle between the first base body surface and the (0001) plane of the first base body and less than an angle between the first-layer surface and the (0001) plane of the first base body.

18. A semiconductor device, comprising:
a first base body including silicon carbide, the first base body including a first base body surface tilted with respect to a (0001) plane of the first base body so that a first line segment where the first base body surface and the (0001) plane of the first base body intersect is along a [11-20] direction of the first base body;
a first layer provided at the first base body surface, the first layer including silicon carbide and including a first-layer surface and a first-layer opposite-surface, the first-layer opposite-surface being between the first base body surface and the first-layer surface, the first-layer surface being tilted with respect to a (0001) plane of the first layer so that a second line segment where the first-layer surface and the (0001) plane of the first layer intersect is along a [−1100] direction; and
a second layer provided at the first-layer surface, the second layer including silicon carbide.

19. The device according to claim 18, further comprising:
a second base body,
the first base body being between the second base body and the first layer,
the second base body including a second base body surface and a second base body opposite-surface,
the second base body surface being between the second base body opposite-surface and the first base body,
an angle between the second base body opposite-surface and the (0001) plane of the first base body being less than an angle between the first base body surface and the (0001) plane of the first base body and less than an angle between the first-layer surface and the (0001) plane of the first base body.

* * * * *